United States Patent
Iyer et al.

(10) Patent No.: US 7,416,995 B2
(45) Date of Patent: Aug. 26, 2008

(54) METHOD FOR FABRICATING CONTROLLED STRESS SILICON NITRIDE FILMS

(75) Inventors: R. Suryanarayanan Iyer, St. Paul, MN (US); Sanjeev Tandon, Sunnyvale, CA (US); Jacob W. Smith, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 235 days.

(21) Appl. No.: 11/273,381

(22) Filed: Nov. 12, 2005

(65) Prior Publication Data

US 2007/0111546 A1 May 17, 2007

(51) Int. Cl.
*H01L 21/31* (2006.01)
(52) U.S. Cl. .............. 438/763; 438/758; 257/E21.033
(58) Field of Classification Search ............ 438/761, 438/763, 791, 758, 783
See application file for complete search history.

(56) References Cited

U.S. PATENT DOCUMENTS

| 5,122,889 | A | | 6/1992 | Kaneko et al. |
| 5,472,890 | A | * | 12/1995 | Oda .................... 438/305 |
| 5,541,434 | A | | 7/1996 | Nicholls et al. |
| 5,670,431 | A | | 9/1997 | Huanga et al. |
| 6,501,122 | B1 | | 12/2002 | Chan et al. |
| 6,713,127 | B2 | | 3/2004 | Subramony et al. |
| 6,821,825 | B2 | | 11/2004 | Todd et al. |
| 2003/0124818 | A1 | | 7/2003 | Luo et al. |
| 2003/0201540 | A1 | * | 10/2003 | Ahn et al. .................... 257/760 |
| 2003/0232514 | A1 | | 12/2003 | Kim et al. |
| 2004/0061118 | A1 | | 4/2004 | Yamazaki et al. |
| 2005/0109276 | A1 | | 5/2005 | Iyer et al. |
| 2005/0287747 | A1 | * | 12/2005 | Chakravarti et al. ......... 438/288 |
| 2006/0160341 | A1 | | 7/2006 | Lin et al. |

OTHER PUBLICATIONS

Smith, J. W., et al., "Thermal Chemical Vapor Deposition of Bis(Tertiary-Butylamino) Silane-baed Silicon Nitride Thin Films", *Journal of the Electrochemical Society*, 152 (4), (2005),G316-G321.
Tamaoki, Naoki , et al., "Low-Temperature Solution for Silicon Nitride LPCVD Using CI-Free Inorganic Trisilylamine", in *Chemical Vapor Deposition XVI and EUROCVD 14*, vol. 1, *Proceedings of the International Sumposium*, M.D. Allendorf et al., Eds.; Proceedings Volumne Aug. 2003,693-700.

* cited by examiner

Primary Examiner—Michael S. Lebentritt
Assistant Examiner—Reema Patel
(74) Attorney, Agent, or Firm—Moser IP Law Group

(57) ABSTRACT

A method for fabricating a multiple layer silicon nitride film on a semiconductor substrate is provided herein. In one embodiment, a method for fabricating a multiple layer silicon nitride film on a semiconductor substrate includes providing a substrate over which the multiple layer silicon nitride film is to be formed; and forming the multiple layer silicon nitride film in a single processing reactor by: (a) depositing a base layer comprising silicon nitride on the base structure; (b) depositing a middle layer comprising a stress-controlling material on the base layer; and (c) depositing a top layer comprising silicon nitride on the middle layer. The stress-controlling material selectively increases or reduces the stress of the multiple layer silicon nitride film as compared to silicon nitride alone.

18 Claims, 5 Drawing Sheets

METHOD FOR FABRICATING CONTROLLED STRESS SILICON NITRIDE FILMS

BACKGROUND OF THE INVENTION

1. Field of the Invention

Embodiments of the invention generally relate to methods for depositing silicon-based materials. More specifically, the present invention relates to chemical vapor deposition techniques for fabricating multi-layer silicon nitride films.

2. Description of the Related Art

Silicon nitride films are commonly utilized in the fabrication of devices that form integrated circuits. These films must possess varying characteristics depending upon the particular application for which the film is being deposited. One characteristic that is critical to control for certain applications is film stress. For example, in some applications, it is desirable to form a silicon nitride film having a higher stress (as compared to an underlying silicon substrate) so as to improve electron mobility through the silicon. Such improved electron mobility increases the speed of an NMOS/NFET device.

In other applications, it is desirable to form a silicon nitride film having a lower stress (as compared to an underlying silicon substrate) so as to minimize dislocation of the layer from, for example, the underlying substrate or to minimize the formation of dislocations in the substrate itself. Such dislocations are detrimental to device functionality as they scatter electron/hole motion and/or enhance diffusion where it is undesirable to do so. In addition, present manufacturing techniques utilize different processing tools to fabricate the spacer structures, resulting in increased time and cost of these components.

Thus, there is a need in the art for an improved method for fabricating silicon nitride films.

SUMMARY OF THE INVENTION

A method for fabricating a multiple layer silicon nitride film on a semiconductor substrate is provided herein. In one embodiment, a method for fabricating a multiple layer silicon nitride film on a semiconductor substrate includes providing a substrate over which the multiple layer silicon nitride film is to be formed; and forming the multiple layer silicon nitride film in a single processing reactor by: (a) depositing a base layer comprising silicon nitride on the base structure; (b) depositing a middle layer comprising a stress-controlling material on the base layer; and (c) depositing a top layer comprising silicon nitride on the middle layer. The stress-controlling material selectively increases or reduces the stress of the multiple layer silicon nitride film as compared to silicon nitride alone.

In another embodiment, a method for fabricating a multiple layer silicon nitride film on a semiconductor substrate includes forming a silicon nitride base layer upon a substrate; forming one or more middle layers upon the base layer, wherein the composition of the one or more middle layers is selected to control the stress of the multiple layer silicon nitride film; and forming a silicon nitride upper layer upon the one or more middle layers.

BRIEF DESCRIPTION OF THE DRAWINGS

The teachings of the present invention will become apparent by considering the following detailed description in conjunction with the accompanying drawings, in which.

Where possible, identical reference numerals are used herein to designate identical elements that are common to the figures. The images in the drawings are simplified for illustrative purposes and are not depicted to scale.

The appended drawings illustrate exemplary embodiments of the invention and, as such, should not be considered as limiting the scope of the invention that may admit to other equally effective embodiments.

DETAILED DESCRIPTION

The present invention is generally a method for fabricating controlled stress, multiple-layer silicon nitride films, also referred to herein as a silicon nitride stack, in integrated semiconductor circuits and devices.

Figure 1:
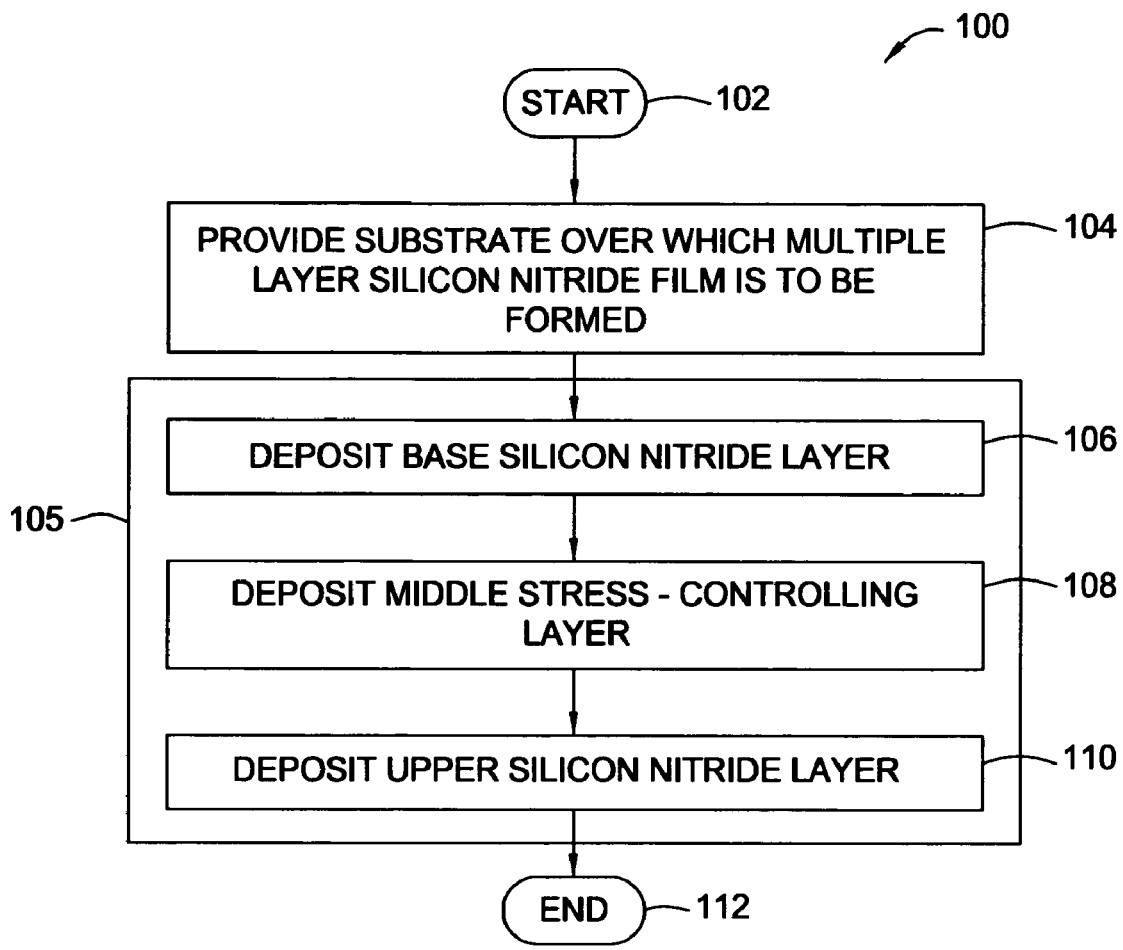
FIG. 1 depicts a flow diagram illustrating a method for fabricating a multiple layer silicon nitride film having a controlled stress in accordance with one embodiment of the present invention.

FIG. 1 depicts a flow diagram illustrating a method 100 for fabricating a multiple layer silicon nitride film over a desired location on a substrate in accordance with one embodiment of the present invention. The method 100 includes processing steps performed upon a substrate during fabrication of the silicon nitride stack. Sub-steps and auxiliary procedures (e.g., process control sub-steps, lithographic routines, and the like) that are well known in the art are omitted herein. Controlled stress, multiple-layer silicon nitride films formed as described in the method 100 are suitable for use in connection with the fabrication of, for example, field effect transistors (FET), dynamic random access memory (DRAM), flash memory, static random access memory (SRAM), advanced image sensors based on complementary metal oxide semiconductor (CMOS) structures, advanced light emitting diode (LED) structures, and the like.

Each of the steps of the method 100 can be performed using a low pressure chemical vapor deposition (LPCVD) reactor, among other suitable processing reactors known to those skilled in the art, such as chemical vapor deposition (CVD) reactors, atomic layer deposition (ALD) reactors, batch deposition reactors, and the like. For example, an ALD reactor may be used to provide a more well-defined and controllable stack at the expense of reduced throughput/additional cost. Alternatively, a CVD reactor may be utilized to increase deposition rates and, thereby, increase throughput/reduced cost. Moreover, each of the steps of the method 100 may be performed in-situ, i.e., in the same process chamber, or within the same process tool. One LPCVD reactor suitable for performing the inventive method is briefly discussed below with reference to FIG. 3. In addition, one LPCVD reactor suitable for performing the method 100 is a SiNgen® Plus LPCVD reactor available from Applied Materials, Inc. of Santa Clara, Calif.

Figure 2:
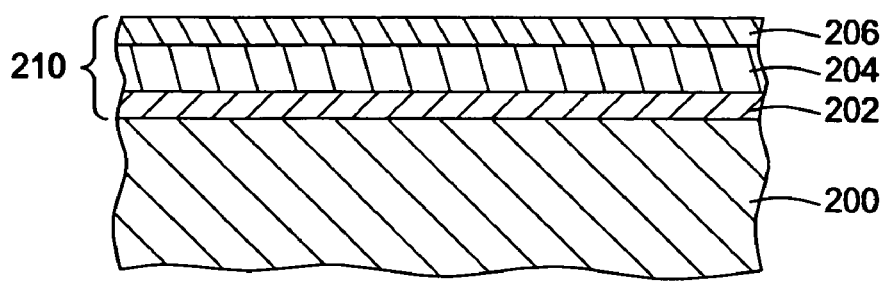
FIG. 2 depicts a schematic, cross-sectional view of a substrate having a stress controlled silicon nitride film fabricated thereupon in accordance with the method of FIG. 1.

FIG. 2 depicts a schematic, cross-sectional view of a substrate where a controlled stress, multiple-layer silicon nitride film 210 is fabricated on a substrate 200 using one embodiment of the method of FIG. 1. The image in FIG. 2 is not depicted to scale and is simplified for illustrative purposes. To best understand the invention, the reader should simultaneously refer to FIGS. 1 and 2.

The method 100 starts at step 102 and proceeds to step 104, where the substrate 200 is provided. Embodiments of the substrate 200 include, but are not limited, to semiconductor wafers, such as crystalline silicon (e.g., Si<100> or Si<111>), silicon oxide, strained silicon, SOI, silicon germanium, doped or undoped polysilicon wafers, and the like. Generally, surfaces on which a controlled stress, multiple-layer silicon nitride film is formed may comprise regions of bare silicon, barrier material, low-k or high-k dielectric material, conductive material, and the like. For example, the controlled stress, multiple-layer silicon nitride film may be formed upon a semiconductor substrate as part of a process of forming certain devices or structures related to an integrated circuit, such as barrier layers, spacer structures, and the like. Optionally, prior to forming the controlled stress, multiple-layer silicon nitride film, the substrate 200 may be pretreated by selectively performing processes such as polishing, annealing, baking, etching, reduction, oxidation, halogenation, hydroxylation, and the like. In one embodiment, the substrate 200 is a crystalline silicon wafer.

At step 105, a multiple layer silicon nitride film 210 having a controlled stress is formed on the substrate 200. Step 105 comprises a series of steps wherein a base layer 202, a middle layer 204, and an upper layer 206 are deposited as described in more detail below.

At step 106, a base layer comprising silicon nitride ($Si_3N_4$) or carbon-doped silicon nitride is deposited on the substrate. In the embodiment depicted in FIG. 2, a base layer 202 is deposited on exposed surfaces of the substrate 200. In other embodiments, the base layer 202 may be deposited over a variety of materials disposed on the substrate, for example, in connection with the fabrication of an integrated circuit or similar device. The base layer 202 comprises silicon nitride or carbon-doped silicon nitride and is deposited to a thickness of about 50-500 Angstroms. In one embodiment, base layer 202 is deposited to a thickness of about 250 Angstroms. The thickness of the base layer 202 is exemplary and is not to be taken as a limiting factor. It is contemplated that layers having other thicknesses may optionally be utilized. It is further contemplated that multiple layers similar to the base layer 202 may be additionally formed on top of the base layer 202 during step 106.

In one embodiment, the base layer 202 is formed using the illustrative chemistries and processes described below. Optionally, the base layer 202 may be doped with other elements to control film characteristics, such as the etch selectivity of the layer with respect chemistries used in further processing of the substrate. In one embodiment, the base layer 202 may be doped with carbon (C). Additional processes for forming silicon nitride and doped silicon nitride films are disclosed in U.S. patent application Ser. No. 11/245,373, filed on Oct. 6, 2005, by R. Suryanarayanan Iyer, et al., and entitled, "METHOD AND APPARATUS FOR THE LOW TEMPERATURE DEPOSITION OF DOPED SILICON NITRIDE FILMS," which is hereby incorporated by reference in its entirety.

In one embodiment, the base layer 202 may be formed using a mixture comprising a nitridation chemical and a silicon source chemical, each in a gaseous or liquid form. In one embodiment, the nitridation chemical comprises at least one of nitrogen ($N_2$), ammonia ($NH_3$), hydrazine ($N_2H_4$) and the like, and the silicon source chemical comprises at least one of bis(tertiary butylamino)silane (BTBAS), silane ($SiH_4$), disilane ($Si_2H_6$), dichlorosilane ($SiH_2Cl_2$), hexachlorodisilane ($Si_2Cl_6$), and the like.

In other embodiments, step 106 may use carbon-containing nitridation chemicals having a chemical formula R(C)—$C_xN_y$R(N), where R(C) is hydrogen (H) or other hydrocarbon compound group, R(N) is nitrogen or other nitrogen containing compound group, and x and y are integers. Examples of suitable chemicals include $(CH_3)_3$—N, $H_3C$—$NH_2$, methylamine, $H_3C$—NH—$NH_2$, methylhydrazine, $(H_3C)$—N=N—H, and HC≡N, among other such chemicals.

In yet other embodiments, step 106 may use hydrogen-containing silicon source chemicals having chemical formulas $(SiR_3)_3$—N, $(SiR_3)_2N$—$N(SiR_3)_2$, or $(SiR_3)N$=$(SiR_3)N$, wherein R is hydrogen (H), a hydrocarbon reagent, or a fragment consisting of methyl, ethyl, phenyl, tertiary, butyl and combinations thereof. In one embodiment, R contains hydrogen and is free of halogens. In another embodiment, R contains hydrogen and one or more halogen elements. Examples of suitable silicon source chemicals include $(SiH_3)_3$—N, $(SiH_3)_2N$—$N(SiH_3)_2$, $(SiH_3)N$=$(SiH_3)N$, and trisilylamine, among other such chemicals. In addition, other source gases disclosed with respect to the other layers and steps described below may be utilized to form like materials in any of the layers described herein. Carbon-doped silicon nitride films may be formed utilizing, e.g., at least one of the carbon-containing silicon source chemicals mentioned above. Alternatively or in combination, carbon source chemicals, such as $C_2H_4$, $C_4H_8$, and the like, may be added to the silicon source and nitridation chemistries disclosed above to form a carbon-doped silicon nitride film.

In one embodiment, the silicon nitride base layer 202 is formed in an LPCVD reactor, such as a SiNgen® Plus 300 mm reactor, by providing ammonia ($NH_3$) at about 10-15,000 sccm, and silane ($SiH_4$) at about 1-100 sccm (i.e., a $NH_3$:$SiH_4$ flow ratio ranging from 1:10 to 15,000:1), while maintaining a substrate pedestal temperature of about 650-800° C. and a chamber pressure of about 10-350 Torr. The duration of the deposition process is about 10-600 sec, but may vary depending on deposition rates and desired layer thicknesses. One specific process provides 10,000 sccm $NH_3$, 17 sccm $SiH_4$ (i.e., a $NH_3$:$SiH_4$ flow ratio of 588:1), while maintaining the substrate temperature at about 700° C. and the chamber pressure at about 240 Torr.

In another embodiment, a carbon-doped silicon nitride base layer 202 is formed in an LPCVD reactor, such as a SiNgen® Plus 300 mm reactor, by providing ammonia ($NH_3$) at about 25-5,000 sccm, and BTBAS at about 50-1,000 mg per min, while maintaining a substrate pedestal temperature of about 600-700° C. and a chamber pressure of about 10-350 Torr. The duration of the deposition process may be about 10-600 sec, but may vary depending on deposition rates and desired layer thicknesses. One specific process provides 40 sccm $NH_3$, 305 mg per min BTBAS, while maintaining the substrate temperature at about 675° C. and the chamber pressure at about 275 Torr. Other examples of process conditions for depositing a doped silicon nitride base layer 202 are described in the previously incorporated U.S. patent application Ser. No. 11/245,373.

At step 108, a middle layer comprising a stress-controlling material is deposited over the base layer. It is contemplated that multiple middle layers may be formed on top of the base layer during step 108 to control the stress of the multiple layer silicon nitride film 210. It is assumed that the individual layers do not interact with each other—i.e., there are no interfacial reactions of consequence to the overall stress value of the multiple layer silicon nitride film. It is further assumed that thermal mismatch stresses are negligible and that stress control of the multiple layer silicon nitride film, or stack, is primarily achieved using the intrinsic stress of each layer. As such, the total stress, σ, of a stack having from 1 to i layers and a total thickness, t, is given as:

$$\sigma = \sigma_1\left(\frac{t_1}{t}\right) + \sigma_2\left(\frac{t_2}{t}\right) + \sigma_3\left(\frac{t_3}{t}\right) + \ldots + \sigma_i\left(\frac{t_i}{t}\right) \quad \text{(Equation 1)}$$

wherein $\sigma_i$ is the stress of the individual $i^{th}$ layer of the stack, and $t_i$ is the thickness of the individual $i^{th}$ layer of the stack (i.e., $t_1+t_2+\ldots+t_i=t$). Thus, the one or more middle layers may be selectively formed to control the overall stress of the multiple layer silicon nitride film.

The selection of the materials used to form the middle layer depends on the desired stress of the middle layer, and thereby, the desired stress of the overall multiple layer silicon nitride film 210. For example, in embodiments where the stress of the multiple-layer silicon nitride film 210 is to be increased, the middle layer comprises a boron-containing material, such as boron nitride (BN) and/or boron-doped silicon nitride (SiN—B). A middle layer comprising such boron-containing material results in a multiple layer silicon nitride film 210 having a higher stress. Alternatively, in embodiments where the stress of the multiple-layer silicon nitride film 210 is to be decreased, the middle layer comprises a carbon-containing material, such as silicon carbide (SiC) and/or carbon-doped silicon nitride (SiN—C), and/or an oxygen-containing material, such as silicon oxide ($SiO_2$) or silicon oxynitride (SiO—N). A middle layer comprising such carbon- or oxygen-containing material results in a multiple layer silicon nitride film 210 having a lower stress. In embodiments wherein properties of the multiple layer silicon nitride film 210 such as refractive index (RI), wet and dry etch rate selectivity, chemical mechanical polishing (CMP) rate, and the like, are to be consistent with the silicon nitride base and upper layers, the middle layer preferably comprises a doped silicon nitride, for example, a boron- or carbon-doped silicon nitride.

In the embodiment depicted in FIG. 2, a middle layer 204 is deposited over the base layer 202. In one embodiment, the middle layer 204 comprises boron-containing material such as boron nitride and/or boron-doped silicon nitride and is formed to a thickness of between approximately 50-500 Angstroms. Alternatively, the middle layer 204 comprises a carbon-containing material, such as silicon carbide and/or carbon-doped silicon nitride and may be formed to a thickness of between approximately 50-500 Angstroms. The thickness values for embodiments of the middle layer 204 are exemplary and are not to be taken as a limiting factor. It is contemplated that layers having other thicknesses may optionally be utilized.

A middle layer 204 comprising a boron-containing silicon nitride film may be formed using the silicon nitride film chemistries described with respect to step 106, above, with the addition of doping chemicals, such as at least one of boron trichloride ($BCl_3$), borane ($BH_3$), diborane ($B_2H_6$), or other boron containing source chemical. Alternatively, a middle layer 204 comprising a carbon containing silicon nitride film may be formed using the carbon-doped silicon nitride film chemistries described with respect to step 106, above.

In one embodiment, using an LPCVD reactor, a boron-containing silicon nitride middle layer 204 may be formed by providing ammonia ($NH_3$) at about 25-5,000 sccm, BTBAS at about 50-1,000 mg per min, and a boron containing source chemical, such as $B_2H_6$ (typically diluted in $H_2$ or He or $N_2$), $BCl_3$, and the like, at about 25-500 sccm, while maintaining a substrate pedestal temperature of about 500-700° C. and a chamber pressure of about 10-350 Torr. The duration of the deposition process may be about 10-600 sec, but may vary depending on deposition rates and desired layer thicknesses. One specific process provides 40 sccm $NH_3$, 305 mg per min BTBAS, and 150 sccm $B_2H_6$, while maintaining the substrate temperature at about 550° C. and a chamber pressure of about 275 Torr.

In another embodiment, using an LPCVD reactor, a boron-containing middle layer 204 may be formed by providing ammonia ($NH_3$) at about 25-5,000 sccm and a boron containing source chemical such as $B_2H_6$ at about 25-500 sccm, while maintaining a substrate pedestal temperature of about 500-700° C. and a chamber pressure of about 10-350 Torr. The duration of the deposition process may be about 10-600 sec, but may vary depending on deposition rates and desired thickness. One specific process provides 40 sccm $NH_3$ and 150 sccm $B_2H_6$, while maintaining a substrate temperature of about 650° C. and a chamber pressure of about 275 Torr.

In another embodiment, a carbon-containing silicon nitride middle layer 204 may be formed using the process described above in reference to step 106. The carbon-containing silicon nitride middle layer 204 may be formed by providing ammonia ($NH_3$) at about 25-5,000 sccm and BTBAS at about 50-1,000 mg per min, while maintaining a substrate pedestal temperature of about 600-700° C. and a chamber pressure of about 10-350 Torr. The duration of the deposition process may be about 10-600 sec, but may vary depending on deposition rates and desired thickness. One specific process provides 40 sccm $NH_3$ and 305 mg per min BTBAS, while maintaining a substrate temperature of about 675° C. and a chamber pressure of about 275 Torr.

In another embodiment, using an LPCVD reactor, a carbon-containing middle layer 204 may be formed by providing ammonia ($NH_3$) at about 25-5,000 sccm and a carbon containing source chemical such as $C_2H_4$ at about 25-500 sccm, while maintaining a substrate pedestal temperature of about 500-700° C. and a chamber pressure of about 10-350 Torr. The duration of the deposition process may be about 10-600 sec, but may vary depending on deposition rates and desired thickness. One specific process provides 40 sccm $NH_3$ and 150 sccm $C_2H_4$, while maintaining a substrate temperature of about 650° C. and a chamber pressure of about 275 Torr.

At step 110, an upper layer is formed atop the middle layer(s) to complete the multiple layer silicon nitride film. The upper layer generally comprises silicon nitride or carbon-doped silicon nitride and, in one embodiment, is formed using the process described above in reference to step 106. The upper layer may be formed to a thickness of between approximately 50-500 Angstroms. In one embodiment, the thickness of the upper layer is approximately 250 Angstroms. The thickness of the upper layer is exemplary and is not to be considered limiting. It is further contemplated that multiple layers similar to the upper layer 204 may additionally be formed on top of the middle layer 204 during step 110.

The total thickness of the multiple layer silicon nitride film is generally between about 200-800 Angstroms. In one embodiment, the total thickness of the multiple layer silicon nitride film is about 750 Angstroms. It is contemplated that the thickness of any or all of the base, middle, and/or upper layers may be adjusted based upon the desired stress or other characteristics required for a particular application. The stress, $\sigma_f$, in a thin film on a substrate is given by Stoney's equation:

$$\sigma_f = \frac{t_s^2 \times E_s(\text{biaxial})}{t_f \times 6R(1-v_s)} \quad \text{(Equation 2)}$$

Wherein $t_s$ and $t_f$ are the substrate and film thicknesses, respectively, $E_s$ and $v_s$ is the Young's modulus and Poisson's ratio of the substrate, and R is the radius of deflection. Stoney's equation and equation 1, above, show that stress is a function of the intrinsic stress of the individual layers and of the thickness of the individual layers. As discussed above, this can be utilized to control the overall film stack stress. As such, knowing the intrinsic stress of each layer, and the boundary conditions of final stress and final thickness required for a particular application allows for the optimal thickness of each layer to be predetermined.

In the embodiment depicted in FIG. 2, an upper layer 206 is deposited atop the middle layer 204. Together, the layers 202, 204, and 206 form the multiple layer silicon nitride film 210.

Upon completion of step 110, at step 112, method 100 ends. The method 100 advantageously utilizes characteristics of component layers and forms multiple layer silicon nitride films having controlled film stress. More particularly, the film stress can be selectively controlled to either increase or decrease the stress of the resultant deposited film by selection and control of the formation of one or more middle layers of the multiple layer silicon nitride film. Thus, it is possible to control the stress of a particular multiple layer silicon nitride film by sequentially depositing various material layers as disclosed hereinabove. Additionally, the layers may advantageously be formed in a single processing reactor, thereby preventing contamination of the multiple layer silicon nitride film layers. After completion of the multiple layer silicon nitride film, additional processing may continue in the same or other process chambers to complete the formation of various devices on the substrate, for example, to continue fabrication of a FET device.

Figure 4:
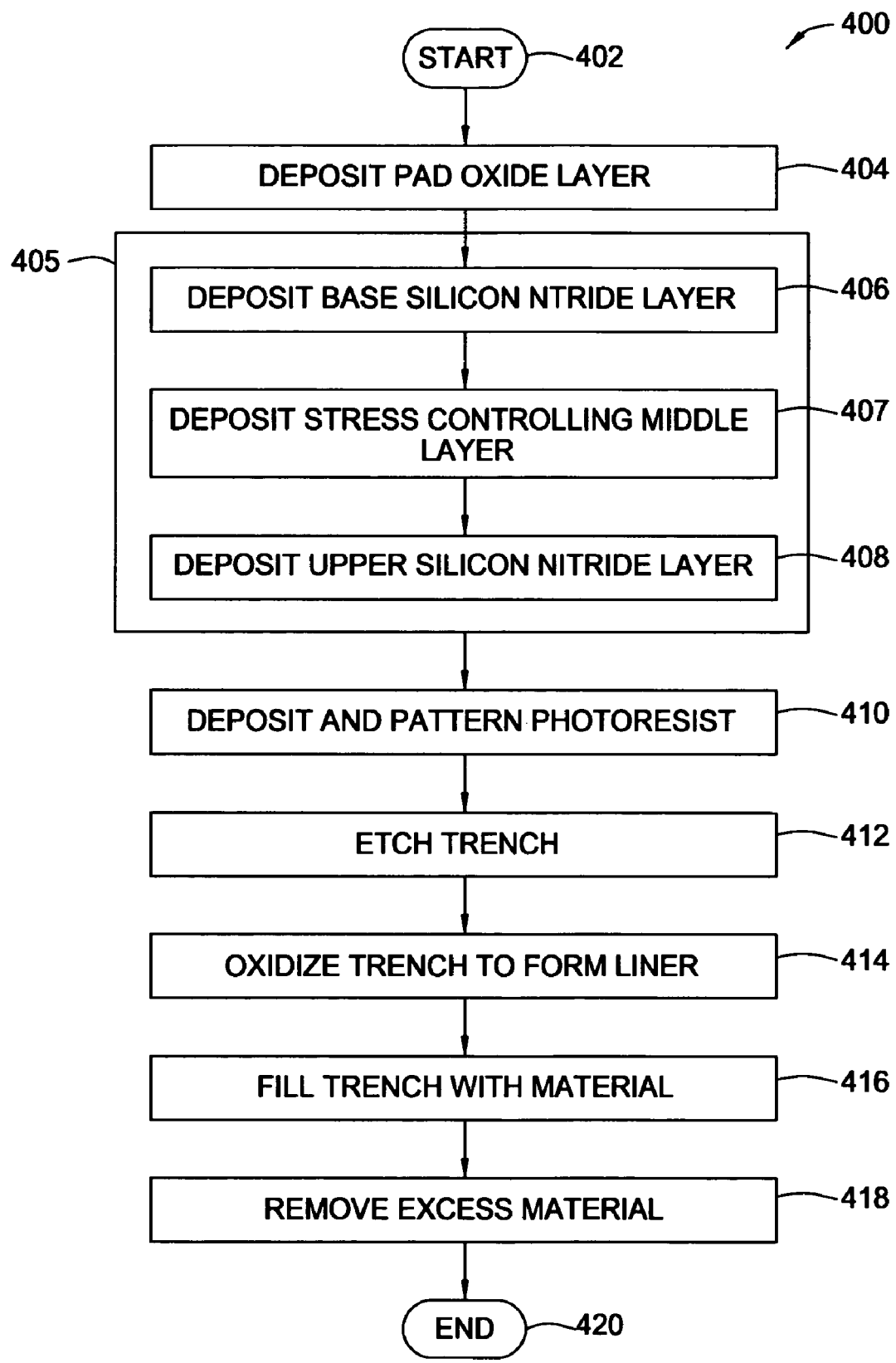
FIG. 4 depicts a flow diagram illustrating one embodiment of a method for fabricating a shallow trench isolation structure utilizing one embodiment of a multiple layer silicon nitride film of the present invention.

FIG. 4 depicts a flow diagram illustrating a method 400 for fabricating a shallow trench isolation (STI) structure in a substrate utilizing one embodiment of a multiple layer silicon nitride film in accordance with one embodiment of the teachings disclosed above. In this example, the objective is to reduce the stress of the overall film stack. The method 400 includes various processing steps performed upon a substrate during fabrication of the STI structure. Sub-steps and auxiliary procedures well known in the art (e.g., process control sub-steps, lithographic routines, and the like) are omitted herein for the sake of clarity.

FIGS. 5A-G together depict a series of schematic, cross-sectional views of a shallow trench isolation (STI) structure being formed in a substrate utilizing one embodiment of a multiple layer silicon nitride film using one embodiment of the method of FIG. 4. In the embodiment depicted in FIGS. 5A-G, the STI structure is formed in a region of a substrate 502 disposed between adjacent devices (not shown), for example transistors, to be subsequently formed on the substrate 502.

The cross-sectional views in FIGS. 5A-G relate to individual processing steps performed to fabricate the STI structure in a substrate, for example, in connection with the fabrication of a field effect transistor (FET). As such, prior and subsequent processing steps that may be performed on the substrate, for example, in connection with the fabrication of the FET or other devices or structures upon a semiconductor substrate, are not shown. In addition, the images in FIGS. 5A-G are not depicted to scale and are simplified for illustrative purposes. To best understand the invention, the reader should simultaneously refer to FIGS. 4 and 5A-G.

Figure 5A:
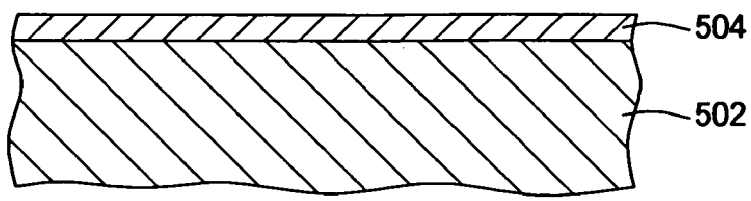
FIGS. 5A-G, together, depict a series of schematic, cross-sectional views of a shallow trench isolation structure fabricated using the method of FIG. 4.

The method 400 starts at step 402 and proceeds to step 404, where a pad oxide layer 504 is formed on the substrate 502, as depicted in FIG. 5A. The substrate 502 may be similar to the substrate 200 described above with respect to FIG. 2. Optionally, prior to forming the STI structure, the substrate 502 may be pretreated by selectively performing processes such as polishing, annealing, baking, etching, reduction, oxidation, halogenation, hydroxylation, and the like. In one embodiment, the substrate 502 is a crystalline silicon wafer.

The pad oxide layer 504 may be formed to a thickness of about 100 to 500 Angstroms from, e.g., silicon oxide ($SiO_2$), silicon oxynitride (SiON), and the like. It is contemplated that other materials and thicknesses may be used to form the pad oxide layer 504 used in connection with fabrication of STI structures. The pad oxide layer 504 may be formed in any suitable reactor, for example the SiNgen® Plus LPCVD reactor. Examples of suitable processes for forming the pad oxide layer 504 are disclosed in U.S. Pat. No. 6,713,127, issued Mar. 30, 2004 to Subramony, et al. (hereinafter the '127 patent), which is hereby incorporated by reference in its entirety.

Figure 5B:
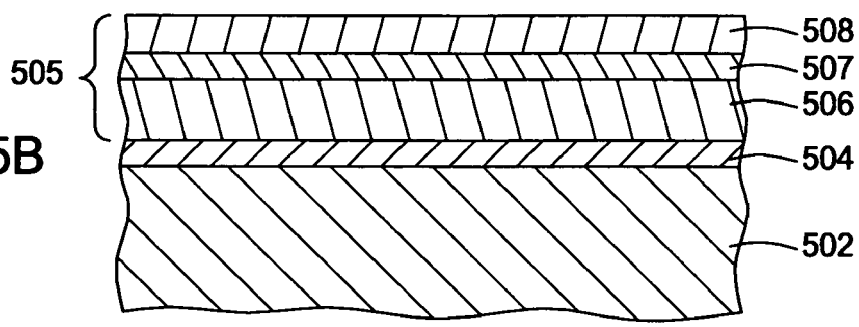

At step 405 a multiple layer silicon nitride film 505 is deposited over the pad oxide layer 504, as depicted in FIG. 5B. The multiple layer silicon nitride film 505 is similar to the multiple layer silicon nitride film 210 disclosed above with reference to FIG. 2. In the embodiment depicted in FIGS. 4 and 5A-G, the multiple layer silicon nitride film 505 comprises a base layer 506 formed atop the pad oxide layer 504 (step 406), a middle layer 407 formed atop the base layer 506 (step 407), and an upper layer 508 formed atop the middle layer 507 (step 408).

At step 406, the base layer 506 is deposited on the pad oxide layer 504. The base layer 506 may be deposited to a thickness of about 500-2,500 Angstroms. In one embodiment, base layer 506 is deposited to a thickness of about 1162.5 Angstroms. It is contemplated that layers having other thicknesses may also be utilized.

The base layer 506 is generally similar to the base layer 202 described above with reference to FIG. 2. In addition, the base layer 506 may have a low-stress interface with the pad oxide layer 504 to facilitate reduction in dislocations of the substrate 502, e.g., dislocations in the crystalline structure of a silicon substrate. The reduction in dislocations of the substrate 502 facilitates reduction in electrical leakage due to electron hopping along those dislocations in the substrate 502. Examples of other chemistries and process conditions suitable for forming a base layer 506 having suitable characteristics for use in the fabrication of STI and other structures is disclosed in U.S. patent application Ser. No. 11/273,380, filed herewith by Iyer, et al., and entitled "METHOD OF FABRICATING A SILICON NITRIDE STACK," which is hereby incorporated by reference in its entirety.

At step 407, the middle layer 507 is deposited over the base layer 506. The middle layer 507 is similar to the middle layer 204 described above with respect to FIG. 2. In one embodiment, the middle layer 507 comprises carbon-doped silicon nitride and/or silicon carbide in order to further reduce the stress of the multiple layer silicon nitride film 505, thereby further reducing the potential for dislocations forming in the substrate 502. The middle layer 507 may be deposited to a thickness of about 100-2,000 Angstroms. In one embodiment, the middle layer 507 is deposited to a thickness of about 387.5 Angstroms. It is contemplated that layers having other thicknesses may optionally be utilized. Optionally, one or more additional layers (not shown) may be deposited between the base layer 506 and the upper layer 508 as described above with respect to FIG. 1.

At step 408, the upper layer 508 is deposited over the base layer 506. The upper layer 508 may be deposited to a thickness of about 100-2,000 Angstroms. The upper layer 508 is similar to the upper layer 206 described above with respect to FIG. 2. In one embodiment, upper layer 508 is deposited to a thickness of about 387.5 Angstroms. It is contemplated that layers having other thicknesses may optionally be utilized. The total thickness of the multiple layer silicon nitride film 505 is generally between about 500-2500 Angstroms.

Although the upper layer 508 may be formed using the process chemistries described above in reference to layer 206, the process parameters utilized to form the upper layer 508 may be selectively controlled to form a film having a high oxidation resistance, for example, to facilitate resistance of the multiple layer silicon nitride film 505 to subsequent oxidation processes that may be performed in the STI structure fabrication process. In addition, the upper layer 508 may further be controlled to have a refractive index (RI) that is optimized, for example, to facilitate photoresist deposition and patterning and subsequent trench etching steps in the STI structure fabrication process. Examples of such process control are described in the previously incorporated U.S. patent application Ser. No. 11/273,380.

Figure 5C:
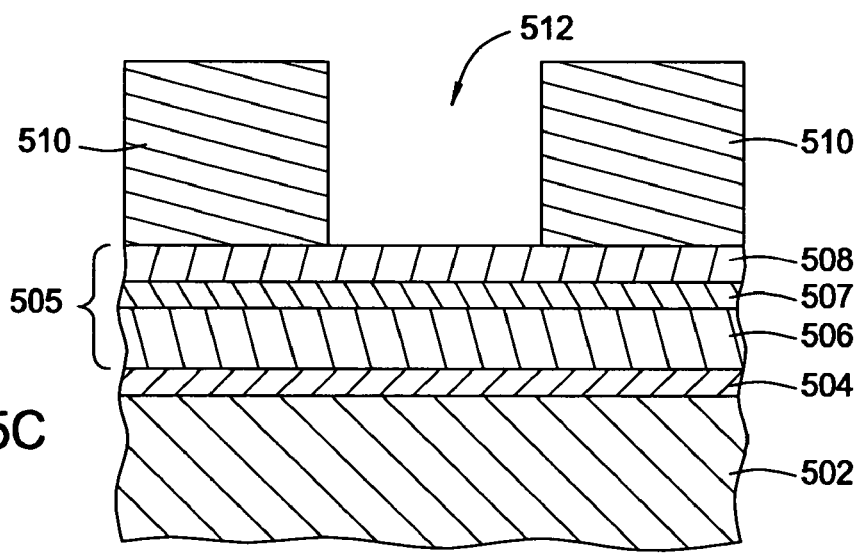

At step 410, a photoresist layer 510 is deposited on the upper layer 508 and patterned to form an opening 512, as depicted in FIG. 5C. The photoresist layer 510 may generally be formed to a thickness of about 2,000-8,000 Angstroms. However, it is contemplated that the thickness of the photoresist layer 510 may be any thickness suitable for subsequent processing and formation of the STI structure. The opening 512 is of a size and shape that corresponds to the region where the trench of the STI structure is to be formed. The photoresist layer 510 may deposited and patterned using conventional methods known in the art.

Figure 5D:
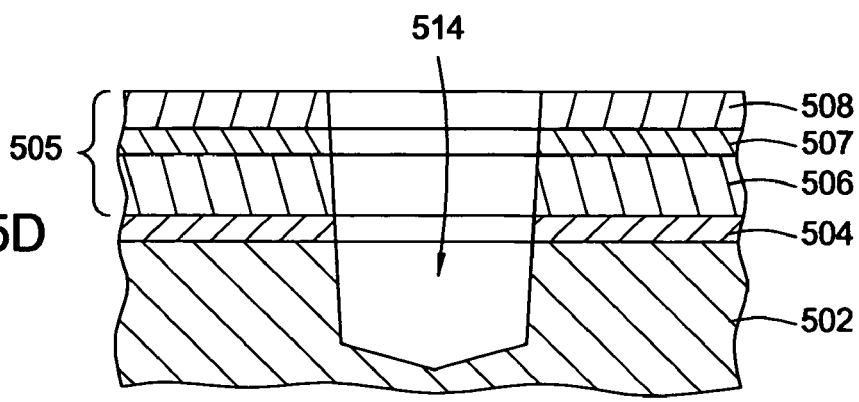

At step 412, using the patterned photoresist layer 510 as a mask, a trench 514 is etched through the multiple layer silicon nitride film 505 and the pad oxide layer 504 and into the substrate 502, as depicted in FIG. 5D. The trench 514 of the STI structure is generally about 2,000-4,000 Angstroms deep and about 1,000-3,000 Angstroms wide. However, it is contemplated that the depth and width of the trench 514 may be any suitable value for use as an STI structure. The trench 514 may be formed by conventional etch methods.

Figure 5E:
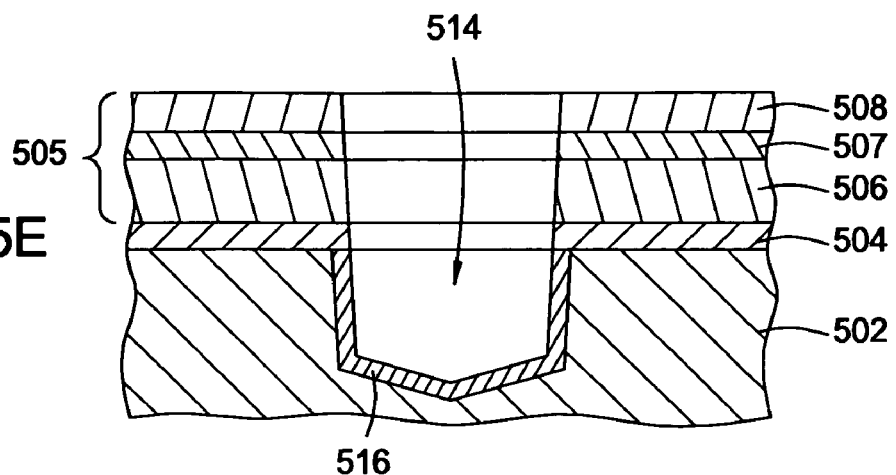

At step 414, the exposed surfaces of the trench (e.g., the substrate 502) are oxidized to form a trench liner 516, as depicted in FIG. 5E. The trench liner 516 generally comprises a layer of silicon oxide formed on the exposed surfaces of the substrate 502 that define the boundaries of the trench 514. The trench liner 516 is generally between about 50-200 Angstroms thick. However, it is contemplated that the thickness of the liner 516 may be any suitable value for use as a trench liner in an STI structure. The trench liner 516 may be formed by any suitable oxidation process, for example, an in-situ steam generation (ISSG) process in a rapid thermal processing (RTP) chamber, such as a RADOX™ chamber available from Applied Materials, of Santa Clara, Calif., or by furnace oxidation.

Figure 5F:
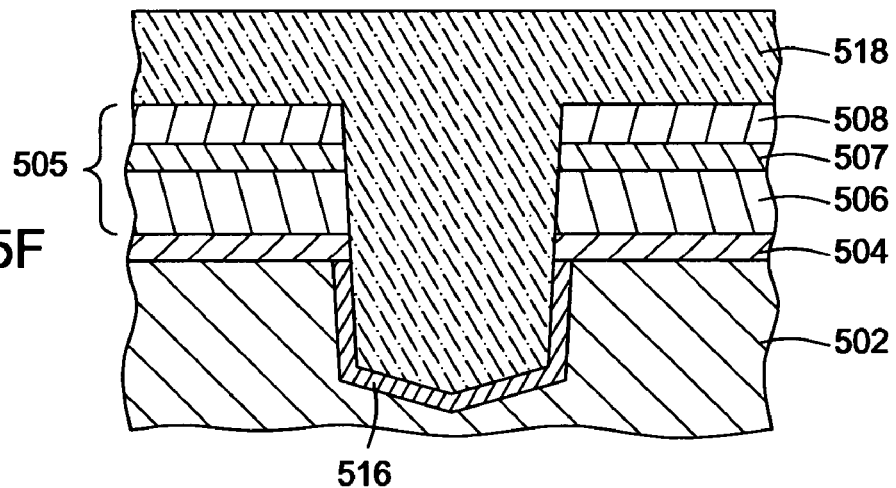
Figure 5G:
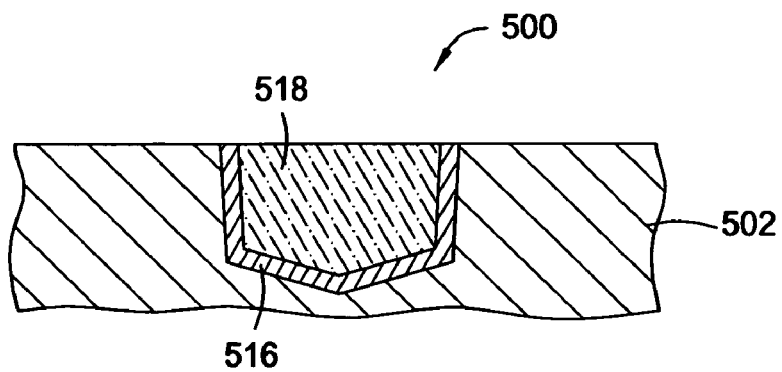

At step 416, a layer of material 518 is deposited to fill the trench 514, as depicted in FIG. 5F. The material 518 may comprise silicon oxide, boron and/or phosphorous doped silicon oxide, or the like. The material 518 is generally deposited in a manner that conformally coats the trench liner 516 and fills the trench 514. The material 518 may be deposited by any suitable method such as chemical vapor deposition (CVD), spin-on coating, and the like, as is known in the art.

At step 418, the excess material 518, the multiple layer silicon nitride film 505, and the pad oxide layer 504 are removed, leaving an STI structure 500 having an upper surface that is substantially flush with an upper surface of the substrate 502. The excess material 518, the multiple layer silicon nitride film 505, and the pad oxide layer 504 may be removed by any suitable process, such as chemical mechanical polishing (CMP), etching, and the like.

Upon completion of step 418, at step 420, the method 400 ends. After completion of the STI structure 500, additional processing may continue in the same or other process chambers to complete the formation of various devices on the substrate. For example, the substrate 502 having the STI structure 500 formed therein may undergo further processing to form transistors or other devices to be isolated from each other on either side of the STI structure 500.

In another example, a stress-controlled, multiple-layer silicon nitride film having a high stress may be utilized to increase the stress induced on an underlying substrate. For example, a stress-controlled, multiple-layer silicon nitride film having a high stress may be formed in place of the nitride etch stop layers described in U.S. patent application Ser. No. 10/885,969, filed Jul. 6, 2004 by Iyer, et al., and entitled, "SILICON NITRIDE FILM WITH STRESS CONTROL."

Figure 3:
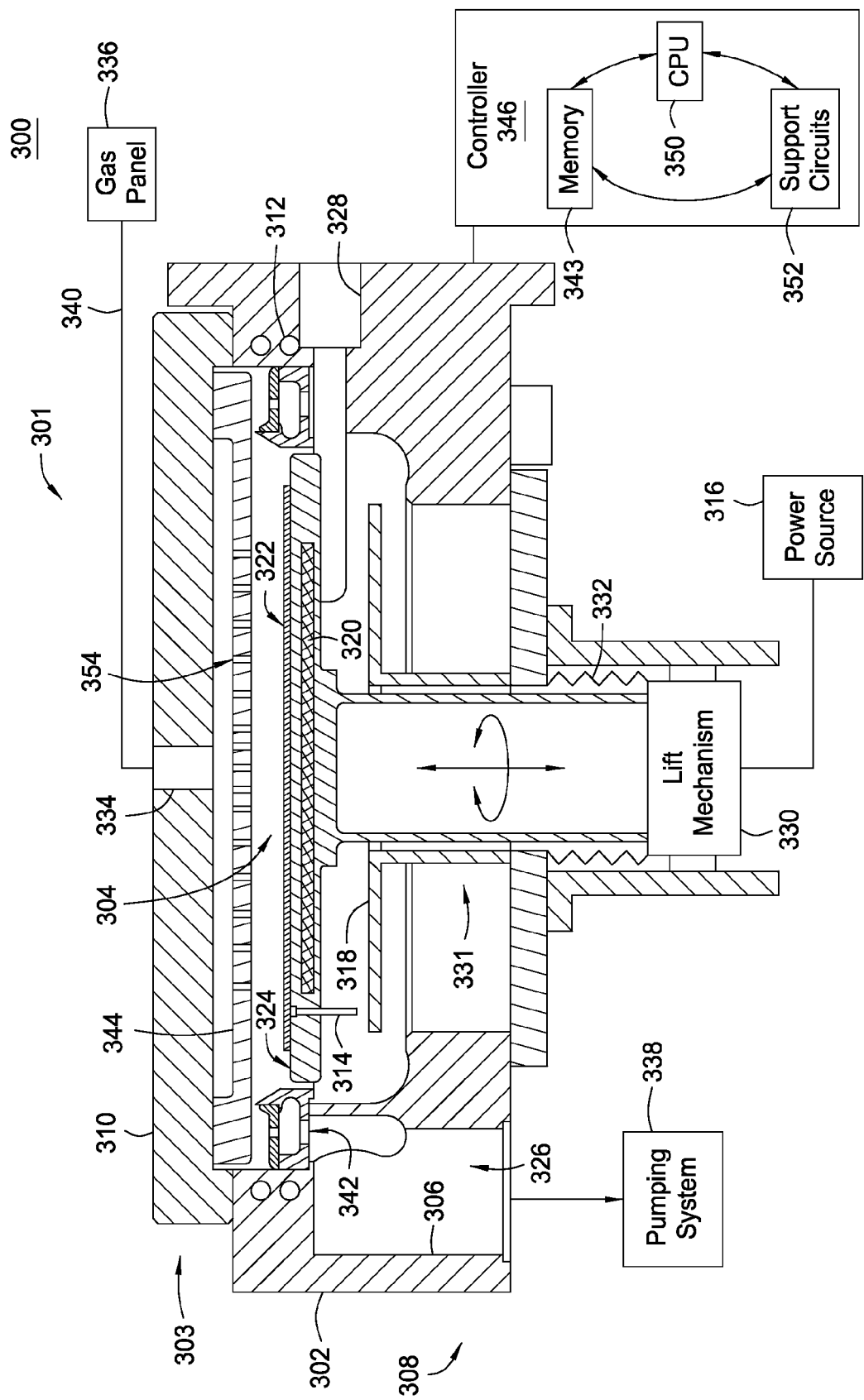
FIG. 3 depicts a schematic diagram of an exemplary CVD reactor of the kind that may be used to practice portions of the method of FIG. 1.

FIG. 3 depicts a schematic diagram of one exemplary LPCVD reactor 300 that may be used to practice portions of the method 100 of FIG. 1. Other examples of suitable LPCVD reactors are described in U.S. patent application Ser. No. 10/911,208, filed Aug. 4, 2004 by Iyer, et al., and U.S. patent application Ser. No. 11/147,938, filed Jun. 8, 2005 by Smith, et al. In the embodiment depicted in FIG. 3, the reactor 300 comprises a processing chamber 301, a pumping system 338, a gas panel 336, a power source 316, and a controller 346.

The processing chamber 301 generally includes an upper assembly 303, a bottom assembly 308, and a pedestal lift assembly 331. The upper assembly 303 generally comprises a lid 310 having an inlet port 334 and a showerhead 344. The bottom assembly 308 houses a substrate support pedestal 324 and comprises a chamber body 302 having a wall 306. A substrate access port 328 is formed in the chamber body 302 to facilitate entry and egress of a substrate 322 into and out of the processing chamber 301. The pedestal lift assembly 331 is coupled to the substrate support pedestal 324 and comprises a lift mechanism 330, a lift plate 318 and a set of lift pins 314.

The substrate support pedestal 324 is disposed in an internal volume 304 of the processing chamber 301 and, during processing, supports the substrate 322. The pedestal 324 includes a heater 320 configured to regulate the temperature of the substrate 322 and/or temperature in the internal volume 304. The heater 320 is coupled to the power source 316 and capable of maintaining the substrate 322 at a temperature of up to about 800° C.

The showerhead 344 provides, through a plurality of openings 354, distribution of gases or vapors delivered from the gas panel 336. Size, geometry, number, and location of the openings 354 are selectively chosen to facilitate a predefined pattern of gas/vapor flow to the substrate 322.

The gas panel 336 provides process chemicals, in liquid and/or gaseous form, to the processing chamber 301. The gas panel 336 is coupled to the lid 310 using a plurality of gas lines 340. Each gas line 340 may be selectively adapted for transferring specific chemical(s) from the gas panel 336 to the inlet port 334, as well as be temperature controlled.

In operation, the pedestal lift assembly 331 controls the elevation of the pedestal 324 between a processing position (as shown in FIG. 3) and a lowered position from which the substrate 322 may transported, through the substrate access port 328, into and out of the processing chamber 301. The assembly 331 is sealingly coupled to the chamber body 302 using a flexible bellows 332 and, optionally, is configured to rotate the substrate support pedestal 324.

The wall 306 may be thermally regulated. In one embodiment, a plurality of conduits 312 are disposed in the wall 306 and configured to circulate a heat transfer fluid regulating the temperature of the wall.

The pumping system 338 is coupled to a pumping port 326 formed in the wall 306. The pumping system 338 generally includes a throttle valve and one or more pumps arranged to control the pressure in the internal volume 304. Gases flowing out of the processing chamber 301 are routed through a pumping ring 342 to enhance gas flow uniformity across the surface of the substrate 322. One such pumping ring is described in U.S. patent Ser. No. 10/911,208, filed Oct. 4, 2004, by Iyer, et al., and entitled "Thermal Chemical Vapor Deposition of Silicon Nitride Using BTBAS Bis(Tertiary-Butylamino Silane) in a Single Wafer Chamber," which is herein incorporated by reference.

In alternate embodiments (not shown), the reactor 300 may comprise a photoexcitation system delivering radiant energy to the substrate 322 through windows in the lid 310, as well as a remote plasma source coupled to the inlet port 334.

The system controller 346 generally comprises a central processing unit (CPU) 350, a memory 343, and support circuits 352 and is coupled to and controls modules and apparatuses of the reactor 300. In operation, the controller 346 directly controls modules and apparatus of the system 300 or, alternatively, administers computers (and/or controllers) associated with these modules and apparatuses.

The invention may be practiced using other processes and/or processing apparatuses where parameters are adjusted to achieve acceptable characteristics by those skilled in the art without departing from the spirit of the invention.

While the foregoing is directed to embodiments of the present invention, other and further embodiments of the invention may be devised without departing from the basic scope thereof, and the scope thereof is determined by the claims that follow.

What is claimed is:

1. A method for fabricating a multiple layer silicon nitride film on a semiconductor substrate, comprising:
   providing a substrate over which the multiple layer silicon nitride film is to be formed; and
   forming the multiple layer silicon nitride film in a single processing reactor by:
      (a) depositing a base layer comprising silicon nitride on the base structure;
      (b) depositing a middle layer comprising a stress-controlling material on the base layer, wherein the stress-controlling material comprises at least one of boron-doped silicon nitride, and wherein the stress-controlling material increases the stress of the multiple layer silicon nitride film; and
      (c) depositing a top layer comprising silicon nitride on the middle layer.

2. The method of claim 1, wherein the base layer, the middle layer, and the top layer are each approximately 50-500 Angstroms thick.

3. The method of claim 2, wherein the multiple layer silicon nitride film is approximately 200-800 Angstroms thick.

4. The method of claim 1, wherein step (a) further comprises:
   depositing a base layer comprising carbon-doped silicon nitride.

5. The method of claim 1, wherein step (b) further comprises:
   depositing two or more middle layers between the base layer and the top layer.

6. The method of claim 1, wherein the top layer further comprises carbon.

7. The method of claim 1, wherein steps (a)-(c) are performed via chemical vapor deposition.

8. The method of claim 1, wherein steps (a)-(c) are performed via atomic layer deposition.

9. A method for fabricating a multiple layer silicon nitride film on a semiconductor substrate, comprising:
   forming a silicon nitride base layer upon a substrate;
   forming one or more middle layers upon the base layer, wherein the composition of the one or more middle layers is selected to control the stress of the multiple layer silicon nitride film and wherein one or more middle layers comprises at least one of boron-doped silicon nitride and boron nitride; and
   forming a silicon nitride upper layer upon the one or more middle layers.

10. The method of claim 9, further comprising:
    forming one or more middle layers comprising at least one of carbon-doped silicon nitride, silicon carbide, silicon oxide, and silicon oxynitride.

11. The method of claim 9, wherein at least one of the silicon nitride base layer and the silicon nitride upper layer are doped with carbon.

12. The method of claim 9, further comprising:
    selectively depositing the one or more middle layers to increase the stress of the multiple layer silicon nitride film.

13. The method of claim 9, further comprising:
    selectively depositing the one or more middle layers to decrease the stress of the multiple layer silicon nitride film.

14. A method for fabricating a multiple layer silicon nitride film on a semiconductor substrate, comprising:
    forming a silicon nitride base layer upon a substrate;
    forming one or more middle layers upon the base layer, wherein the composition of the one or more middle layers is selected to increase the stress of the multiple layer silicon nitride film; and
    forming a silicon nitride upper layer upon the one or more middle layers.

15. The method of claim 14, wherein one or more of the one or more middle layers comprises at least one of boron-doped silicon nitride and boron nitride.

16. The method of claim 14, further comprising:
    forming one or more middle layers comprising at least one of carbon-doped silicon nitride, silicon carbide, silicon oxide, and silicon oxynitride.

17. The method of claim 14, wherein at least one of the silicon nitride base layer and the silicon nitride upper layer are doped with carbon.

18. The method of claim 14, further comprising:
    selectively depositing the one or more middle layers to decrease the stress of the multiple layer silicon nitride film.

* * * * *

UNITED STATES PATENT AND TRADEMARK OFFICE
CERTIFICATE OF CORRECTION

PATENT NO. : 7,416,995 B2
APPLICATION NO. : 11/273381
DATED : August 26, 2008
INVENTOR(S) : R. Suryanarayanan Iyer et al.

Page 1 of 1

It is certified that error appears in the above-identified patent and that said Letters Patent is hereby corrected as shown below:

In column 11, line 55, Claim 1, insert -- or boron nitride -- after "boron-doped silicon nitride".

Signed and Sealed this

Eighteenth Day of November, 2008

JON W. DUDAS
*Director of the United States Patent and Trademark Office*